United States Patent
Lee et al.

(10) Patent No.: US 10,355,027 B2
(45) Date of Patent: Jul. 16, 2019

(54) DISPLAY DEVICE

(71) Applicant: SAMSUNG DISPLAY CO., LTD., Yongin-si, Gyeonggi-do (KR)

(72) Inventors: Seungkyu Lee, Cheonan-si (KR); Inwoo Kim, Asan-si (KR); Saehee Ryu, Asan-si (KR); Kwangsu Park, Yongin-si (KR); Seongjun Hwang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 49 days.

(21) Appl. No.: 15/815,107

(22) Filed: Nov. 16, 2017

(65) Prior Publication Data

US 2018/0138214 A1 May 17, 2018

(30) Foreign Application Priority Data

Nov. 16, 2016 (KR) .................. 10-2016-0152735

(51) Int. Cl.
  *G09G 3/06* (2006.01)
  *H01L 27/12* (2006.01)
  *G02F 1/1335* (2006.01)
  *G02F 1/1339* (2006.01)
  *G02F 1/1343* (2006.01)
  (Continued)

(52) U.S. Cl.
  CPC ........ *H01L 27/1244* (2013.01); *G02F 1/1343* (2013.01); *G02F 1/13458* (2013.01); *G02F 1/133512* (2013.01); *G02F 1/133514* (2013.01); *G02F 1/136286* (2013.01); *G09G 3/06* (2013.01); *G02F 2001/13396* (2013.01);
  (Continued)

(58) Field of Classification Search
  CPC ............ G02F 1/1343; G02F 1/136286; G02F 1/133512; G02F 1/133514; G02F 1/13458; G02F 2203/69; G02F 2001/13396; G02F 2001/136254; G09G 3/06; H01L 27/1244
  See application file for complete search history.

(56) References Cited

U.S. PATENT DOCUMENTS 8,064,027 B2  11/2011  Choi et al.
2004/0105062 A1  6/2004  Lai et al.
(Continued)

FOREIGN PATENT DOCUMENTS

KR  10-2009-0126052 A  12/2009
KR  10-1326246 B1  10/2013
(Continued)

*Primary Examiner* — Muhammad N Edun
(74) *Attorney, Agent, or Firm* — Innovation Counsel LLP (57) ABSTRACT

A display device is capable of substantially preventing a short circuit between a common electrode and a test pad, the display device including: a first substrate and a second substrate; a thin film transistor disposed on the first substrate; a gate line and a data line connected to the thin film transistor; a test pad portion connected to the data line; a test line connecting the test pad portion and the data line; and a spacer disposed on the first substrate. The spacer includes: a first spacer disposed on the display area and supporting the first substrate and the second substrate; a second spacer disposed on the display area, the second spacer having a less height than a height of the first spacer; and a third spacer overlapping the test line and the test pad portion disposed on the non-display area, the third spacer not contacting the second substrate.

19 Claims, 7 Drawing Sheets

(51) Int. Cl.
    *G02F 1/1345*     (2006.01)
    *G02F 1/1362*     (2006.01)

(52) U.S. Cl.
    CPC ............ *G02F 2001/136254* (2013.01); *G02F 2203/69* (2013.01)

(56) References Cited

U.S. PATENT DOCUMENTS

| | | | |
|---|---|---|---|
| 2009/0294771 | A1 | 12/2009 | Kim et al. |
| 2013/0049029 | A1* | 2/2013 | Kim ................ H01L 27/124 257/88 |
| 2016/0105952 | A1* | 4/2016 | Park ................ G02F 1/1309 345/174 |
| 2016/0170273 | A1 | 6/2016 | Lee et al. |
| 2016/0377938 | A1 | 12/2016 | Hong et al. |

FOREIGN PATENT DOCUMENTS

| | | |
|---|---|---|
| KR | 10-2016-0072335 A | 6/2016 |
| KR | 10-2017-0001812 A | 1/2017 |

\* cited by examiner

DISPLAY DEVICE

CROSS-REFERENCE TO RELATED APPLICATION

This application claims priority under 35 U.S.C. § 119 to Korean Patent Applications No. 10-2016-0152735, filed on Nov. 16, 2016, in the Korean Intellectual Property Office (KIPO), the disclosure of which is incorporated by reference herein in its entirety.

TECHNICAL FIELD

Exemplary embodiments of the present inventive concept relate to a display device.

DISCUSSION OF RELATED ART

In recent information society, display devices are becoming more important as a visual information delivery medium. In order to take a major position in the future, it is necessary to meet requirements such as low power consumption, slimness, light weight and high image quality.

Such display devices may be classified into a self-luminous type, e.g., a cathode ray tube ("CRT") display device, an electroluminescence ("EL") display device, a light emitting diode ("LED") display device, a vacuum fluorescent display ("VFD") device, a field emission display ("FED") device and a plasma display panel ("PDP") device, and a non-self-luminous type, e.g., a liquid crystal display ("LCD") device.

The display device performs a test on a circuit wiring using a test apparatus during the manufacturing process. The test apparatus may be damaged by a probing pin and thus, a short circuit may occur between the test apparatus and a common electrode, resulting in degradation of display quality.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present inventive concept may be directed to a display device capable of substantially preventing a short circuit between a common electrode and a test unit for performing a test on a circuit wiring.

According to an exemplary embodiment, a display device includes: a first substrate and a second substrate, each including a display area and a non-display area; a thin film transistor disposed on the display area of the first substrate; a gate line and a data line connected to the thin film transistor; a test pad portion connected to the data line; a test line connecting the test pad portion and the data line; and a spacer disposed on the first substrate. The spacer includes: a first spacer disposed on the display area and supporting the first substrate and the second substrate; a second spacer disposed on the display area, the second spacer having a less height than a height of the first spacer; and a third spacer overlapping the test line and the test pad portion disposed on the non-display area, the third spacer not contacting the second substrate.

At least one of the test lines may be disposed between the test pad portions.

The data line, the test line and the test pad portion may be unitary.

The first spacer, the second spacer and the third spacer may include a substantially same material.

The display device may further include an insulating interlayer disposed on the first substrate.

The spacer may include a substantially same material as a material included in the insulating interlayer.

The first spacer, the second spacer and the third spacer may include an organic material.

The display device may further include a black matrix disposed on the first substrate.

The spacer may include a substantially same material as a material included in the black matrix.

The spacer may include one of an opaque organic layer forming material and a photosensitive composition.

The display device may further include a color filter at the display area of the first substrate.

The spacer may include a substantially same material as a material included in the color filter.

The spacer may include a photosensitive organic material.

The second spacer and the third spacer may have a same height.

The second spacer may have a height greater than that of the third spacer.

The spacer may be disposed on a color filter on the first substrate.

The display device may further include a color filter disposed on the first substrate and a black matrix disposed on the second substrate. The spacer may be formed of a same material as the color filter.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Advantages and features of the inventive concept and methods for achieving them will be made clear from exemplary embodiments described below in detail with reference to the accompanying drawings. The inventive concept may, however, be embodied in many different forms and should not be construed as being limited to the exemplary embodiments set forth herein. Rather, these exemplary embodiments are provided so that this disclosure will be thorough and complete and will fully convey the scope of the inventive concept to those skilled in the art. The inventive concept is merely defined by the scope of the claims. Therefore, well-known constituent elements, operations and techniques are not described in detail in the exemplary embodiments in order to prevent the inventive concept from being obscurely interpreted. Like reference numerals refer to like elements throughout the specification.

In the drawings, certain elements or shapes may be illustrated in an enlarged manner or in a simplified manner to better illustrate the inventive concept and other elements present in an actual product may also be omitted. Thus, the drawings are intended to facilitate the understanding of the present inventive concept.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have a same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

A display device according to an exemplary embodiment is to be described as an LCD device by way of example, but exemplary embodiments are not limited thereto. In an exemplary embodiment, the display device may be an organic light emitting diode ("OLED") display device, a PDP device and an electrophoretic display device.

Figure 1:
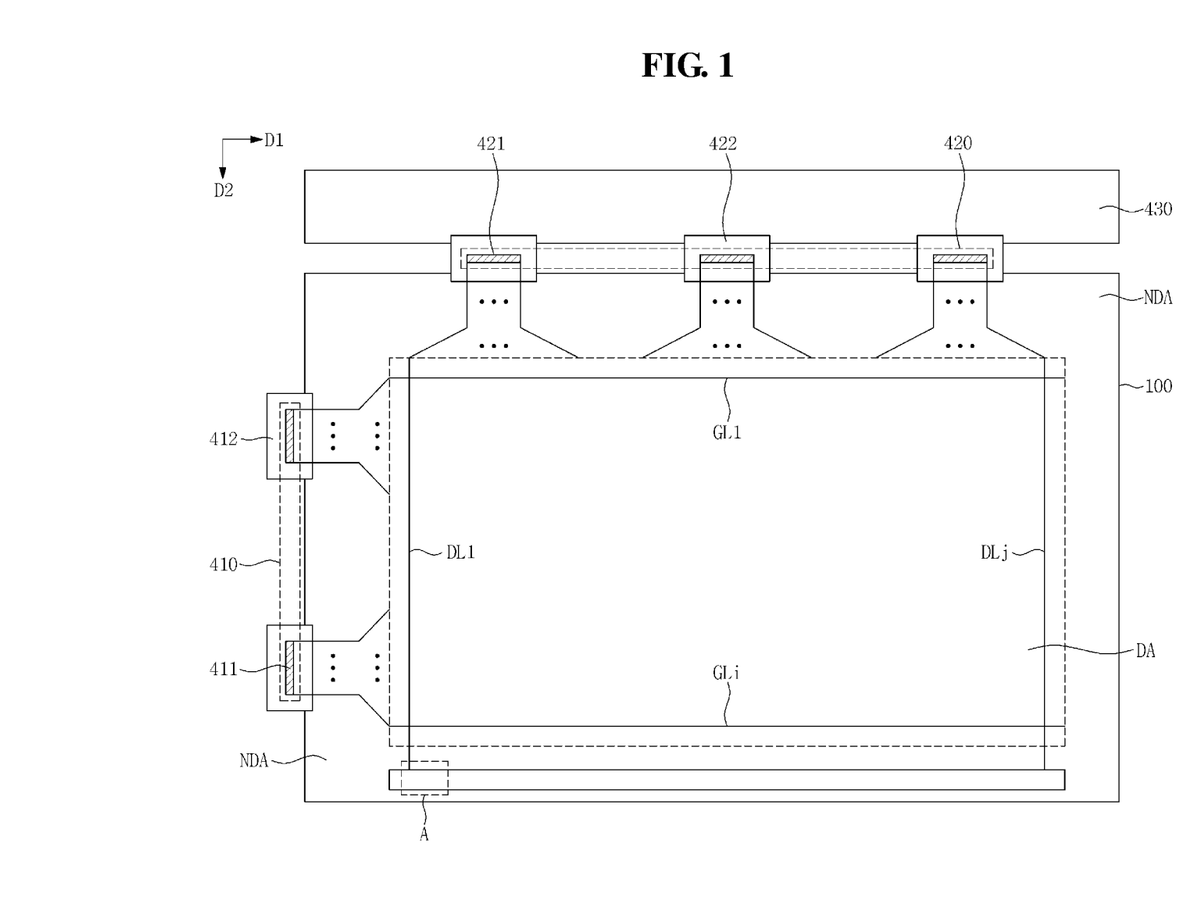
FIG. 1 is a view illustrating a lower panel of an LCD device and a peripheral circuit connected thereto according to an exemplary embodiment.

Hereinafter, an exemplary embodiment will be described in detail with reference to FIGS. 1, 2, 3, 4 and 5. FIG. 1 is a view illustrating a lower panel of an LCD device and a peripheral circuit connected thereto according to an exemplary embodiment, and FIG. 2 is a schematic view illustrating pixels included in the display panel 10 of FIG. 1.

Figure 2:
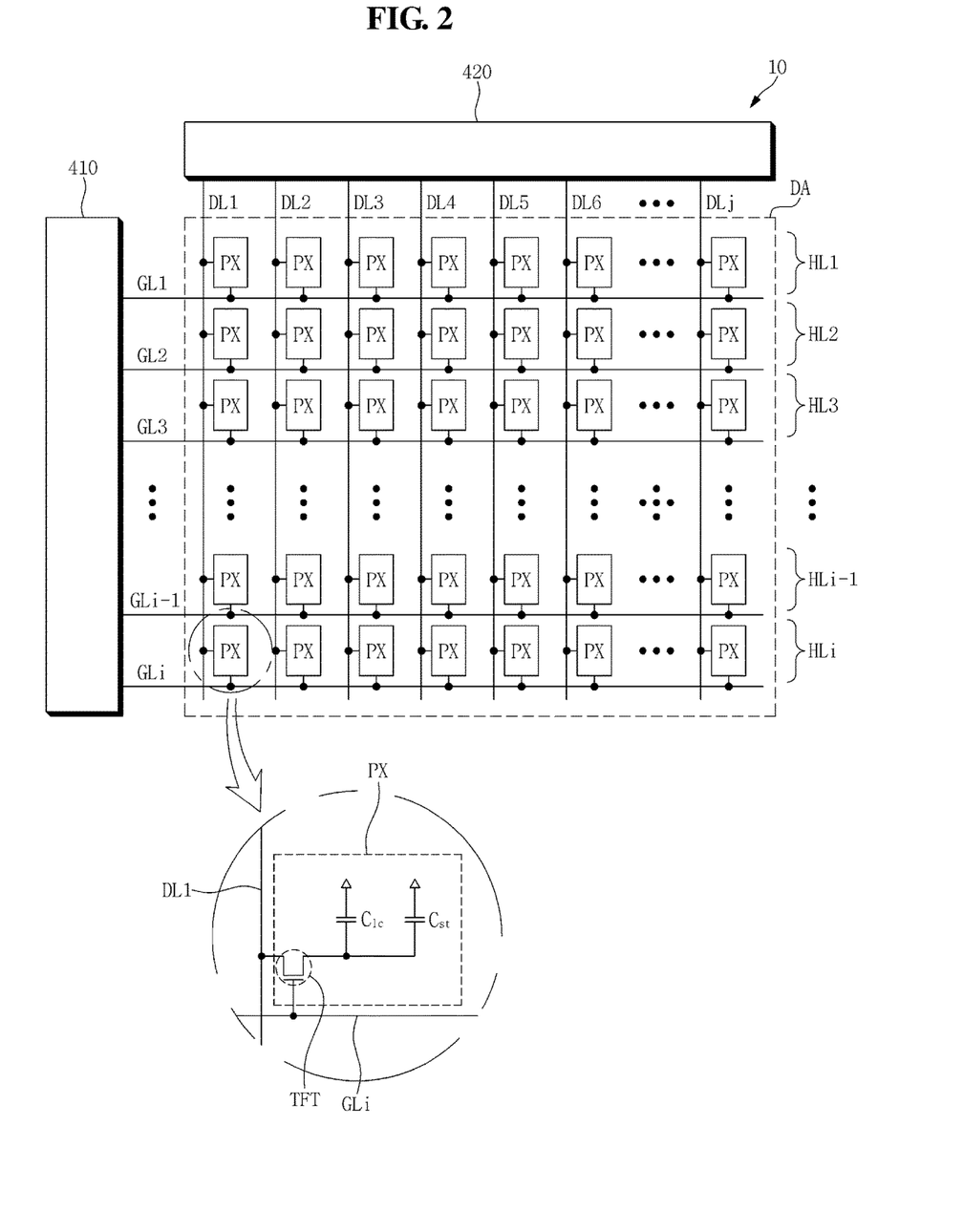
FIG. 2 is a schematic view illustrating pixels included in the display panel of FIG. 1.

As illustrated in FIGS. 1 and 2, an LCD device according to an exemplary embodiment includes a display panel 10, a gate driver 410 and a data driver 420.

Figure 5:
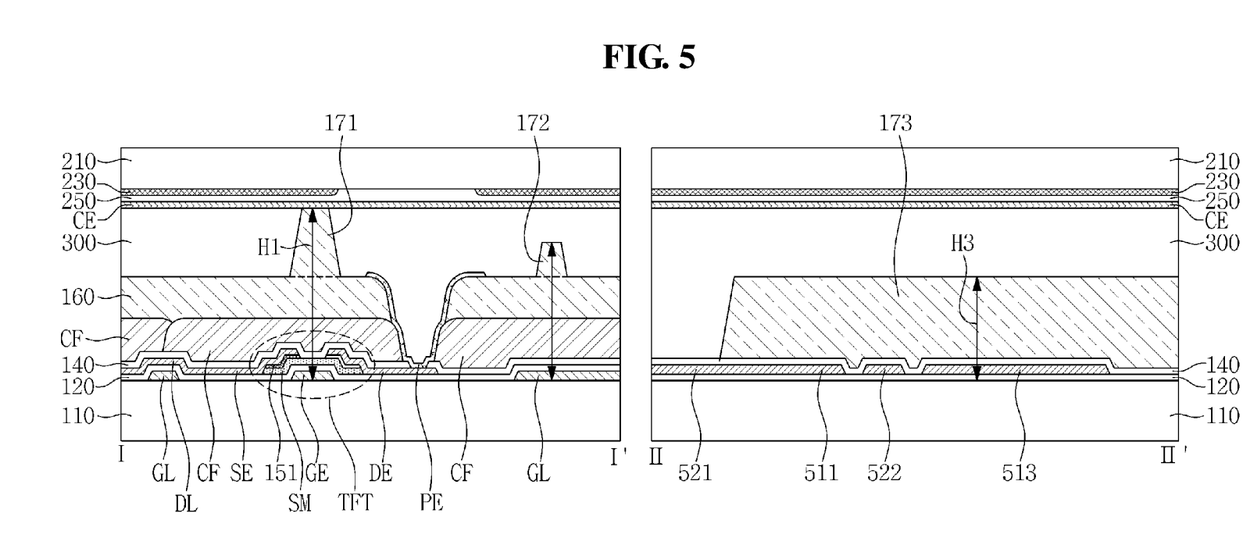
FIG. 5 is a cross-sectional view taken along line I-I' of FIG. 3 and a cross-sectional view taken along line II-IT of FIG. 4 according to an exemplary embodiment.

The display panel 10, as illustrated in FIG. 5, includes a lower panel 100, an upper panel 200 and a liquid crystal layer 300. The display panel 10 is divided into a display area DA and a non-display area NDA.

The display area DA of the display panel 10 corresponds to a display area DA of the lower panel 100 and a display area DA of the upper panel 200. The non-display area NDA of the display panel 10 corresponds to a non-display area NDA of the lower panel 100 and a non-display area NDA of the upper panel 200.

Figure 4:
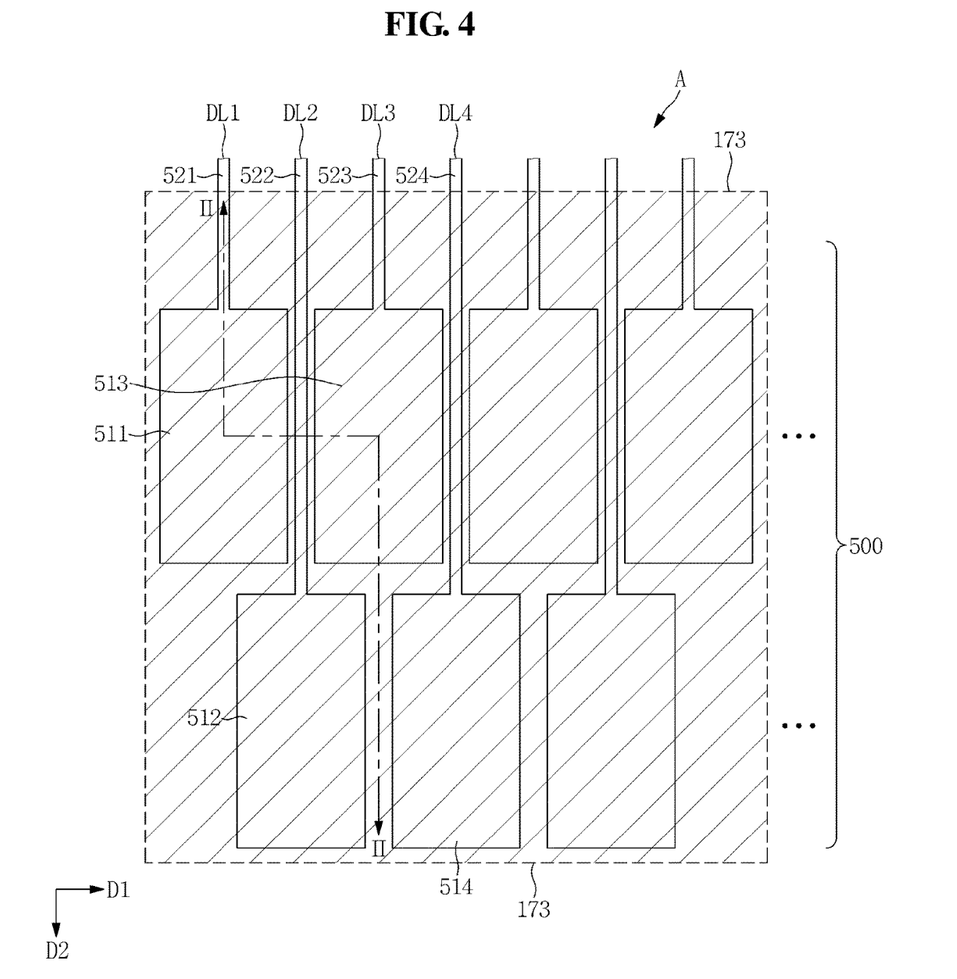
FIG. 4 is a plan view illustrating an area A of FIG. 1.

The lower panel 100 includes a lower substrate 110, a plurality of gate lines GL1 to GLi, a plurality of data lines DL1 to DLj, a common line (not illustrated) and a test unit 500 (see FIG. 4). The gate lines GL1 to GLi, the data lines DL1 to DLj and the common lines are disposed on the lower substrate 110.

The data lines DL1 to DLj intersect the gate lines GL1 to GLi. The gate lines GL1 to GLi extend along a first direction D1 to the non-display area NDA to be connected to the gate driver 410, and the data lines DL1 to DLj extend along a second direction D2, which intersects the first direction D1, to the non-display area NDA to be connected to the data driver 420.

The gate driver 410 includes a plurality of gate driving integrated circuits (ICs) 411. The gate driving ICs 411 generate gate signals and sequentially apply the gate signals to first to i-th gate lines GL1 to GLn.

The respective gate driving ICs 411 are mounted on gate carriers 412. The gate carriers 412 are electrically connected to the lower panel 100.

The data driver 420 includes a plurality of data driving ICs 421. The data driving ICs 421 receive digital image data signals and a data control signal from a timing controller. The data driving ICs 421 sample the digital image data signals according to the data control signal, latch the sampled image data signals corresponding to one horizontal line in each horizontal period and apply the latched image data signals to the data lines DL1 to DLj. That is, the data driving ICs 421 convert the digital image data signals applied from a timing controller into analog image signals using a gamma voltage input from a power supply (not illustrated) and apply the converted analog image signals to the data lines DL1 to DLj.

The respective data driving ICs 421 are mounted on data carriers 422. The data carriers 422 are connected between a circuit board 430 and the lower panel 100. For example, each of the data carriers 422 may be electrically connected between the circuit board 430 and the non-display area NDA of the lower substrate 110.

The aforementioned timing controller and the power supply may be disposed on the circuit board 430, and the data carrier 422 includes input wirings for transmitting various signals applied from the timing controller and the power supply to the data driving ICs 421 and output wirings for transmitting image data signals output from the data driving ICs 421 to respective corresponding ones of the data lines. In an exemplary embodiment, at least one data carrier 422 may further include auxiliary wirings for transmitting various signals applied from the timing controller and the power supply to the gate driver 410 and the auxiliary wirings are connected to panel wirings disposed on the lower panel 101. The panel wirings connect the auxiliary wirings and the gate driver 410 to each other. The panel wirings may be formed on the non-display area NDA of the lower substrate 110 in a line-on-glass manner.

The common line receives a common voltage from the aforementioned power supply. To this end, the common line may be connected to the power supply through a line at the gate carrier 412 and a line at the data carrier 422.

As illustrated in FIG. 2, the display panel 10 includes a plurality of pixels PX. The pixels PX are disposed on the display area DA of the display panel 10.

The pixels PX are arranged in a matrix configuration. The pixels PX are classified into a red pixel displaying a red image, a green pixel displaying a green image and a blue pixel displaying a blue image. In such an exemplary embodiment, a red pixel, a green pixel and a blue pixel that are adjacently disposed in a horizontal direction may define a unit pixel for displaying a unit image.

There are "j" number of pixels arranged along an n-th horizontal line (hereinafter, n-th horizontal line pixels), which are connected to the first to j-th data lines DL1 to DLj, respectively, where n is one selected from 1 to i. Further, the n-th horizontal line pixels are connected in common to an n-th gate line. Accordingly, the n-th horizontal line pixels receive an n-th gate signal as a common signal. That is, "j" number of pixels in a same horizontal line receive a same gate signal at the same time, while pixels in different horizontal lines receive different gate signals, respectively. For example, a red pixel and a green pixel in a first horizontal line HL1 all receive a first gate signal, while a red pixel and a green pixel in a second horizontal line HL2 all receive a second gate signal which has a different timing from a timing of the first gate signal.

As illustrated in FIG. 2, each of the pixels PX includes a thin film transistor ("TFT"), a liquid crystal capacitor Clc and a storage capacitor Cst.

The TFT is turned on according to a gate signal applied from the gate line GLi. The turned-on TFT applies the analog image signal applied from the data line DL1 to the liquid crystal capacitor Clc and the storage capacitor Cst.

The liquid crystal capacitor Clc includes a pixel electrode PE (see FIG. 5) and a common electrode CE (see FIG. 5) which oppose each other.

The storage capacitor Cst includes a pixel electrode PE and an opposing electrode which oppose each other. In such an exemplary embodiment, the opposing electrode may be a previous gate line GLi-1 or a transmission line (not illustrated) which transmits the common voltage.

Figure 3:
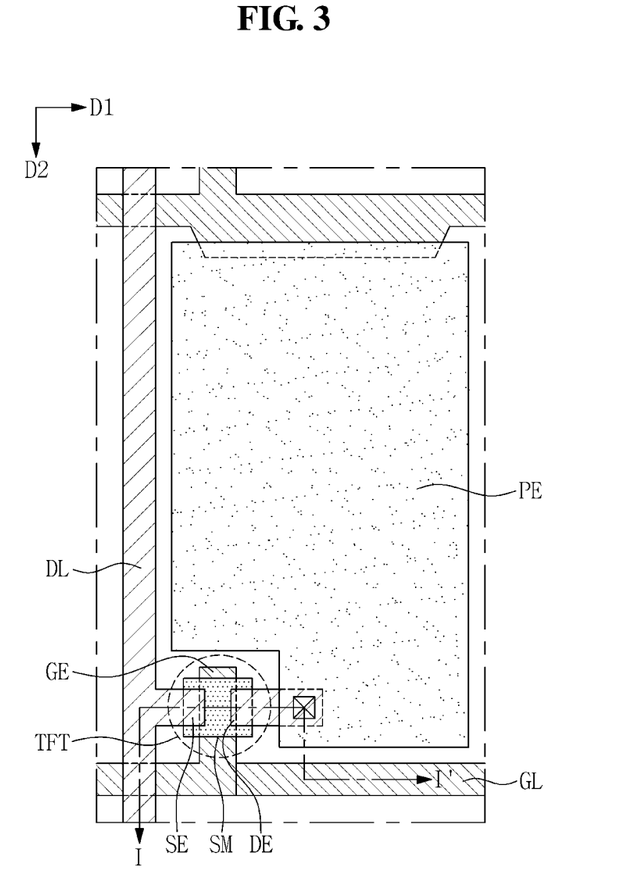
FIG. 3 is a plan view illustrating one pixel included in the display panel of FIG. 1.

FIG. 3 is a plan view illustrating one pixel included in the display panel 10 of FIG. 1, FIG. 4 is a plan view illustrating an area A of FIG. 1, and FIG. 5 is a cross-sectional view taken along line I-I' of FIG. 3 and a cross-sectional view taken along line II-II' of FIG. 4 according to an exemplary embodiment.

A configuration of the display panel 10 will be described in more detail with reference to FIGS. 3, 4 and 5.

As illustrated in FIGS. 3, 4 and 5, the lower panel 100 includes the lower substrate 110, the gate line GL, the data line DL, the TFT, a gate insulating layer 120, a protective layer 140, a color filter CF, an insulating interlayer 160, a pixel electrode PE, spacers 171, 172 and 173 and a test pad 500.

The lower substrate 110 may be an insulating substrate having light transmitting characteristics and flexible characteristics, e.g., a plastic substrate. However, exemplary embodiments are not limited thereto and the lower substrate 110 may include a hard substrate, e.g., a glass substrate.

The TFT includes a gate electrode GE, a semiconductor layer SM, an ohmic contact layer 151, a source electrode SE and a drain electrode DE.

The gate line GL extends along the first direction D1 on the lower substrate 110 and the gate electrode GE protrudes from the gate line GL. A contact portion (e.g., an end portion) of the gate line GL may have a larger area than an area of another portion of the gate line GL for connection to another layer or an external driving circuit. At least one of the gate line GL and the gate electrode GE may include or be formed of one of: aluminum (Al) or alloys thereof, silver (Ag) or alloys thereof, copper (Cu) or alloys thereof, molybdenum (Mo) or alloys thereof. Alternatively, at least one of the gate line GL and the gate electrode GE may include or be formed of one of: chromium (Cr), tantalum (Ta), and/or titanium (Ti). Alternatively, at least one of the gate line GL and the gate electrode GE may have a multilayer structure including at least two conductive layers that have different physical properties.

The gate insulating layer 120 is disposed on the gate line GL and the gate electrode GE. In such an exemplary embodiment, the gate insulating layer 120 may be disposed over an entire surface of the lower substrate 110 including the gate line GL and the gate electrode GE. The gate insulating layer 120 may include or be formed of silicon nitride (SiNx) or silicon oxide (SiOx). The gate insulating layer 120 may have a multilayer structure including at least two insulating layers having different physical properties.

The semiconductor layer SM is disposed on the gate insulating layer 120. In such an exemplary embodiment, the semiconductor layer SM overlaps the gate electrode GE. The semiconductor layer SM may include amorphous silicon, polycrystalline silicon, or the like.

The ohmic contact layer 151 is disposed on the semiconductor layer SM. The ohmic contact layer 151 may include silicide or n+hydrogenated amorphous silicon doped with n-type impurities, e.g., phosphorus (P), at high concentration. The ohmic contact layers 151 may be disposed on the semiconductor layer SM in pairs.

The source electrode SE is disposed on an ohmic contact layer 151 contacting a portion of the semiconductor layer SM. The source electrode SE extends from the data line DL. For example, as illustrated in FIG. 3, the source electrode SE has a shape protruding from the data line DL toward the gate electrode GE. The source electrode SE overlaps the semiconductor layer SM and the gate electrode GE. The source electrode SE may include or be formed of a refractory metal, e.g., molybdenum, chromium, tantalum and titanium, and/or an alloy thereof. The source electrode SE may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer and a molybdenum (alloy) upper layer. In an exemplary embodiment, the source electrode SE may include or be formed of any suitable metals and/or conductors rather than the aforementioned materials.

The drain electrode DE is disposed on an ohmic contact layer 151 contacting another portion of the semiconductor layer SM. The drain electrode DE overlaps the gate electrode GE and the semiconductor layer SM. The drain electrode DE is connected to the pixel electrode PE. The drain electrode DE may include a substantially same material and have a substantially same structure (a multilayer structure) as those of the source electrode SE. In other words, the drain electrode DE and the source electrode SE may be formed substantially simultaneously in a substantially same process.

The gate electrode GE, the source electrode SE and the drain electrode DE, together with the semiconductor layer SM and the ohmic contact layer 151, define a TFT. In such an exemplary embodiment, a channel of the TFT is disposed at a portion of the semiconductor layer SM between the source electrode SE and the drain electrode DE.

The data line DL is disposed on the gate insulating layer 120, extending along the second direction D2 which intersects the first direction D1. Although not illustrated, a contact portion (e.g., an end portion) of the data line DL may have a larger area than an area of another portion of the data line DL for connection to another layer or an external driving circuit. The data line DL intersects the gate line GL. Although not illustrated, a portion of the data line DL intersecting the gate line GL may have a less line width than a line width of another portion of the data line DL. Accordingly, a parasitic capacitance between the data line DL and the gate line GL may be reduced. The data line DL may include a substantially same material and have a substantially same structure (a multilayer structure) as those of the source electrode SE. In other words, the data line DL and the source electrode SE may be formed substantially simultaneously in a substantially same process.

The protective layer 140 is disposed on the data line DL, the source electrode SE, the drain electrode DE and the gate insulating layer 120. In such an exemplary embodiment, the protective layer 140 may be disposed on an entire surface of the lower substrate 110 including the data line DL, the source electrode SE, the drain electrode DE and the gate insulating layer 120. The protective layer 140 has a drain contact hole exposing the drain electrode DE. The protective layer 140 may include an inorganic insulating material, e.g., silicon nitride ($SiN_x$) or silicon oxide ($SiO_x$) and in such an exemplary embodiment, an inorganic insulating material having photosensitivity and a dielectric constant of about 4.0 may be used. In an alternative exemplary embodiment, the protective layer 140 may have a double-layer structure including a lower inorganic layer and an upper organic layer, which is found to impart excellent insulating characteristics and not to damage an exposed portion of the semiconductor layer SM. The protective layer 140 may have a thickness greater than or equal to about 5000 Å, e.g., in a range from about 6000 Å to about 8000 Å.

The color filter CF is disposed on the protective layer 140. The color filter CF is disposed corresponding to an opening of a black matrix 230. An edge of the color filter CF may overlap an edge of another color filter adjacent to said color filter CF. The color filter CF may include a photosensitive organic material.

The insulating interlayer 160 is disposed on the color filter CF and the protective layer 140. The insulating interlayer 160 may include an organic material.

The pixel electrode PE is connected to the drain electrode DE through the drain contact hole. The pixel electrode PE is disposed on the insulating interlayer 160. The pixel electrode PE may include a transparent conductive material, e.g., indium tin oxide (ITO) or indium zinc oxide (IZO). In such an exemplary embodiment, for example, ITO may include a polycrystalline material or a monocrystalline material or IZO may also include a polycrystalline material or a monocrystalline material.

The spacers 171, 172 and 173 are disposed on the lower substrate 110 including the insulating interlayer 160. The spacers 171, 172 and 173 include a first spacer 171, a second spacer 172 and a third spacer 173.

The first spacer 171 and the second spacer 172 are disposed on the display area DA of the lower substrate 110. For example, the first spacer 171 and the second spacer 172 may be disposed on the TFT, the gate line GL or the data line DL.

According to an exemplary embodiment, the first spacer 171, the second spacer 172 and the insulating interlayer 160 may be formed substantially simultaneously in a substantially same process. Accordingly, the first spacer 171, the second spacer 172 and the insulating interlayer 160 may include a substantially same material and be formed into a single piece.

The first spacer 171 is disposed between the lower substrate 110 and the upper substrate 210 to support the lower substrate 110 and the upper substrate 210. A gap between the pixel electrode PE and the common electrode CE, that is, a cell gap, may be kept constant by the first spacer 171. That is, the first spacer 171 contacts the common electrode CE disposed on the upper substrate 210.

The second spacer 172, dissimilar to the first spacer 171, does not contact the upper substrate 210 including the common electrode CE. For example, when lengths from the lower substrate 110 to respective upper surfaces of the spacers 171, 172 and 173 are defined as heights H1, H2 an H3 of the spacers 171, 172 and 173, the height H2 of the second spacer 172 is less than the height H1 of the first spacer 171.

The third spacer 173 will be described in detail below.

Although not illustrated, a lower alignment layer may be disposed on the pixel electrode PE, the insulating interlayer 160 and the spacers 171, 172 and 173. The lower alignment layer may be a vertical alignment layer or a photo-alignment layer including a photo-polymerizable material.

The liquid crystal layer 300 is disposed between the lower panel 100 and the upper panel 200. The liquid crystal layer 300 may include liquid crystal molecules that have negative dielectric anisotropy and are vertically aligned when no electric field is applied to the liquid crystal molecules. Alternatively, the liquid crystal layer 300 may include a photo-polymerizable material and in such an exemplary embodiment, the photo-polymerizable material may be a reactive monomer or a reactive mesogen.

As illustrated in FIG. 5, the upper panel 200 includes an upper substrate 210, the black matrix 230, a planarization layer 250 and the common electrode CE.

The upper substrate 210 may be an insulating substrate having light transmitting characteristics and flexible characteristics, e.g., a plastic substrate. However, exemplary embodiments are not limited thereto and the upper substrate 210 may include a hard substrate, e.g., a glass substrate.

The black matrix 230 is disposed on the upper substrate 210. For example, the black matrix 230 may be disposed to overlap the gate line GL, the data line DL and the TFT at the display area DA, thus defining a pixel area, and may be further disposed at the non-display area NDA to define the display area DA and the non-display area NDA.

The black matrix 230 may include a metal, e.g., chromium oxide (CrOx), an opaque organic layer forming material, a photosensitive composition, or the like. Examples of the photosensitive composition may include: a binder resin, a polymerizable monomer, a polymerizable oligomer, a pigment, a dispersant and a photoinitiator. The pigment may use a black pigment, a black resin, or the like.

The planarization layer 250 is disposed on the black matrix 230. The planarization layer 250 planarizes an uneven surface of a layer therebelow, e.g., the black matrix 230, or substantially prevents the diffusion of impurities from the layer therebelow into the liquid crystal layer 300.

The common electrode CE may be disposed over an entire surface of the upper substrate 210 including the planarization layer 250. The common electrode CE may be a plate electrode which is formed into a single piece and includes a transparent conductor, e.g., indium tin oxide (ITO) and indium zinc oxide (IZO).

Although not illustrated, an upper alignment layer may be disposed on the common electrode CE. The upper alignment layer may be a vertical alignment layer or a photo-alignment layer including a photo-polymerizable material.

A test pad 500 according to an exemplary embodiment is to be described in detail with reference to FIGS. 4 and 5.

The test pad 500 according to an exemplary embodiment is disposed on the non-display area NDA of the lower panel 100, as illustrated in FIG. 1, and includes test pad portions 511, 512, 513 and 514 and test line portions 521, 522, 523 and 524.

The test pad portions 511, 512, 513 and 514 are disposed on the lower substrate 110. For example, the test pad portions 511, 512, 513 and 514 may be disposed on the gate insulating layer 120. The test pad portions 511, 512, 513 and 514 may include a first test pad 511, a second test pad 512, a third test pad 513 and a fourth test pad 514.

Each of the test pad portions 511, 512, 513 and 514 are connected to a respective data lines DL1, DL2, D13 and D14. For example, as illustrated in FIG. 4, the first test pad 511 may be connected to a first data line DL1, the second test pad 512 may be connected to a second data line DL2, the third test pad 513 may be connected to a third data line DL3, and the fourth data pad 514 may be connected to a fourth data line DL4.

The test pad portions 511, 512, 513 and 514 and the data lines DL may include a substantially same material and have a substantially same structure (a multi-layer structure). In other words, the test pad portions 511, 512, 513 and 514 and the data line DL may be formed substantially simultaneously in a substantially same process and be formed into single piece.

The test line portions 521, 522, 523 and 524 are disposed on the lower substrate 110. For example, as illustrated in FIG. 5, the test line portions 521, 522, 523 and 524 may be disposed on the gate insulating layer 120. The test line portions 521, 522, 523 and 524 may include a first test line 521, a second test line 522, a third test line 523 and a fourth test line 524.

The test line portions 521, 522, 523 and 524 extend along the second direction D2 to connect the test pad portions 511, 512, 513 and 514 to the data line DL. For example, as illustrated in FIG. 4, the first test line 521 connects the first data line DL1 and the first test pad 511, the second test line 522 connects the second data line DL2 and the second test pad 512, the third test line 523 connects the third data line DL3 and the third test pad 513, and the fourth test line 524 connects the fourth data line DL4 and the fourth test pad 514.

The test line portions 521, 522, 523 and 524 may include a substantially same material and have a substantially same structure (a multilayer structure) as those of the data line DL and the data pad portions 511, 512, 513 and 514. In other words, the test line portions 521, 522, 523 and 524, the test pad portions 511, 512, 513 and 514 and the data line DL may be formed substantially simultaneously in a substantially same process. However, exemplary embodiments are not limited thereto, and the test line portions 521, 522, 523 and 524 may include a metal, a metal alloy, a metal nitride, a conductive metal oxide, a transparent conductive material, or the like, which are different from the material included in the test pad portions 511, 512, 513 and 514 and the data line DL. In such an exemplary embodiment, although not illustrated, the test line portions 521, 522, 523 and 524 may be connected to the data line DL through a contact hole and may be connected to the test pad portions 511, 512, 513 and 514 through another contact hole.

At least one test line may be disposed between the test pad portions. For example, as illustrated in FIG. 4, the second test line 522 may be disposed between the first test pad 511 and the third test pad 513. Accordingly, an area between adjacent test pad portions may be secured.

Referring to FIGS. 4 and 5, the third spacer 173 is disposed on the test pad 500. For example, the third spacer 173 is disposed on the protective layer 140 corresponding to the test pad portions 511, 512, 513 and 514 and the test line portions 521, 522, 523 and 524.

According to an exemplary embodiment, the first spacer 171, the second spacer 172, the third spacer 173 and the insulating interlayer 160 may be formed substantially simultaneously in a substantially same process. Accordingly, the first spacer 171, the second spacer 172, the third spacer 173 and the insulating interlayer 160 may include a substantially same material. For example, the first spacer 171, the second spacer 172, the third spacer 173 and the insulating interlayer 160 may include an organic material.

As illustrated in FIG. 5, the third spacer 173 does not contact the upper substrate 210 including the common electrode CE. For example, the height H3 of the third spacer 173 is substantially equal to or less than the height H2 of the second spacer 172.

According to an exemplary embodiment, the third spacer 173 is disposed on the test pad portions 511, 512, 513 and 514 and the test line portions 521, 522, 523 and 524 such that a short circuit that may occur between the common electrode CE and respective ones of the test pad portions 511, 512, 513 and 514 and the test line portions 521, 522, 523 and 524 may be substantially prevented.

Figure 6:
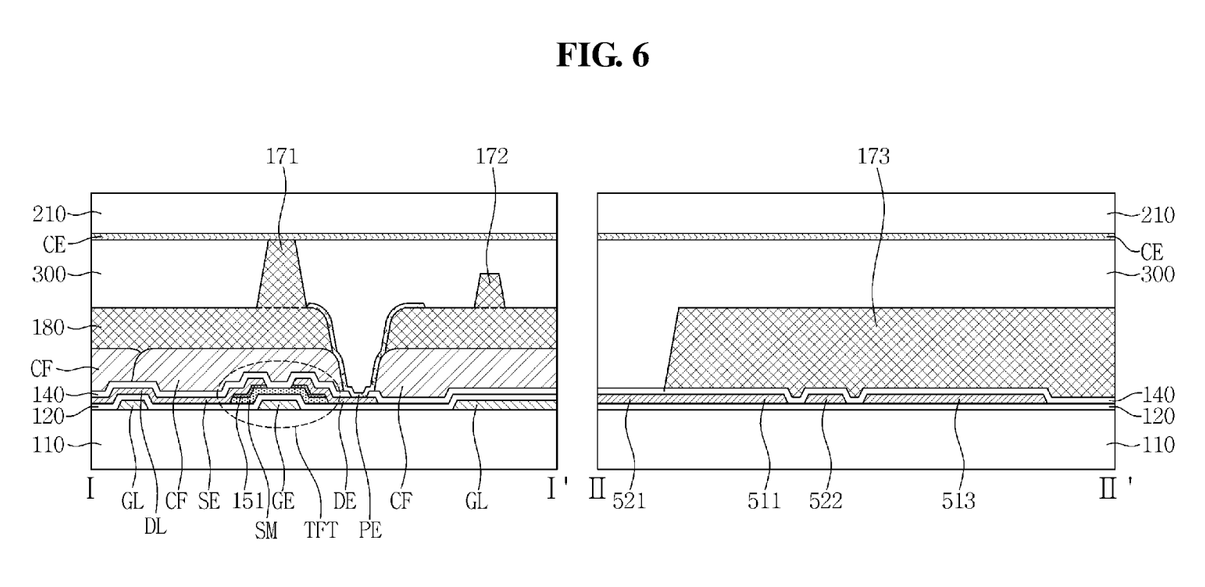
FIG. 6 is a cross-sectional view taken along line I-I' of FIG. 3 and a cross-sectional view taken along line II-IT of FIG. 4 according to an alternative exemplary embodiment.

Hereinafter, an alternative exemplary embodiment will be described in detail with reference to FIG. 6. FIG. 6 is a cross-sectional view taken along line I-I' of FIG. 3 and a cross-sectional view taken along line II-II' of FIG. 4 according to an alternative exemplary embodiment.

The redundant descriptions related to the display device according to an exemplary embodiment will be omitted from the descriptions related to the display device according to an alternative exemplary embodiment.

According to an alternative exemplary embodiment, as illustrated in FIG. 6, a black matrix 180 is disposed on a lower substrate 110. For example, the black matrix 180 is disposed on a color filter CF and a protective layer 140. The black matrix 180 may be disposed to overlap the gate line GL, the data line DL and the TFT at the display area DA, thus defining a pixel area, and may be further disposed at the non-display area NDA to define the display area DA and the non-display area NDA.

The black matrix 180 may include a metal oxide, e.g., chromium oxide (CrOx), an opaque organic layer forming material, a photosensitive composition, or the like. Examples of the photosensitive composition may include: a binder resin, a polymerizable monomer, a polymerizable oligomer, a pigment, a dispersant and a photoinitiator. The pigment may use a black pigment, a black resin, or the like.

According to an alternative exemplary embodiment, a first spacer 171, a second spacer 172, a third spacer 173 and the black matrix 180 may be formed substantially simultaneously in a substantially same process. Accordingly, the first spacer 171, the second spacer 172, the third spacer 173 and the black matrix 180 may include a substantially same material. For example, the first spacer 171, the second spacer 172, the third spacer 173 and the black matrix 180 may include one of a metal oxide, an opaque organic layer forming material and a photosensitive composition.

According to an alternative exemplary embodiment, the third spacer 173 is disposed on test pad portions 511, 512, 513 and 514 and test line portions 521, 522, 523 and 524 such that a short circuit that may occur between the common electrode CE and respective ones of the test pad portions 511, 512, 513 and 514 and the test line portions 521, 522, 523 and 524 may be substantially prevented.

Figure 7:
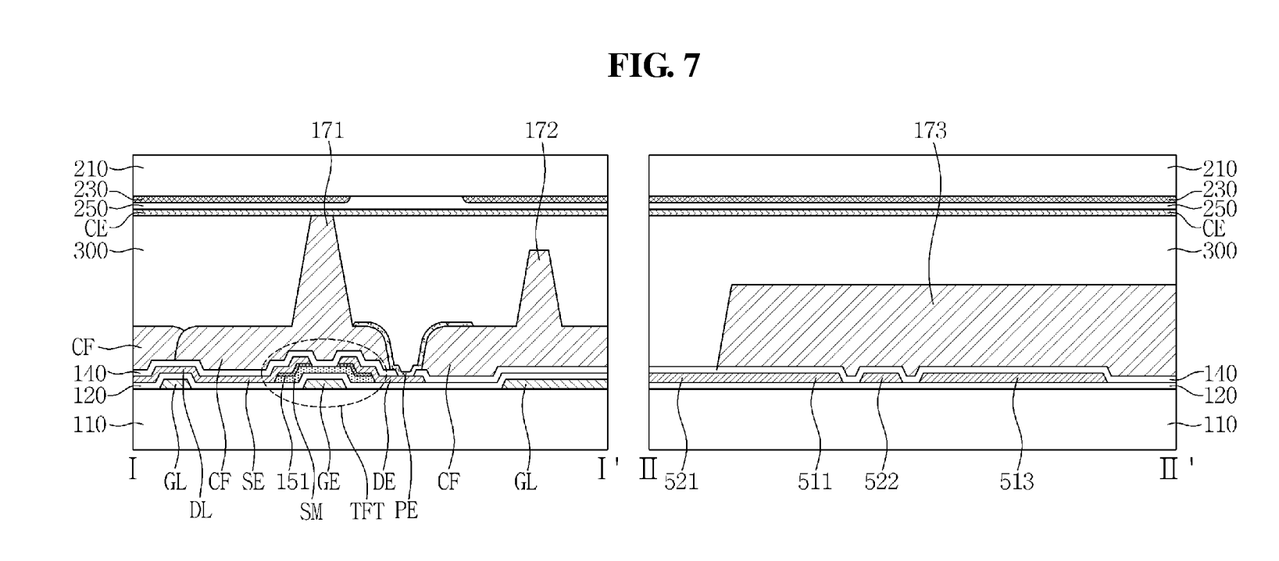
FIG. 7 is a cross-sectional view taken along line I-I' of FIG. 3 and a cross-sectional view taken along line II-IT of FIG. 4 according to another alternative exemplary embodiment.

Hereinafter, another alternative exemplary embodiment will be described in detail with reference to FIG. 7. FIG. 7 is a cross-sectional view taken along line I-I' of FIG. 3 and a cross-sectional view taken along line II-II' of FIG. 4 according to another alternative exemplary embodiment.

The redundant descriptions related to the display device according to an exemplary embodiment and the display device according to an alternative exemplary embodiment will be omitted from the descriptions related to the display device according to another alternative exemplary embodiment.

An insulating interlayer 160 may be omitted, as illustrated in FIG. 7. However, exemplary embodiments are not limited thereto and the insulating interlayer 160 may be disposed on a color filter CF.

According to another alternative exemplary embodiment, a first spacer 171, a second spacer 172, a third spacer 173 and the color filter CF may be formed substantially simultaneously in a substantially same process. Accordingly, the first spacer 171, the second spacer 172, the third spacer 173 and the color filter CF may include a substantially same material. For example, the first spacer 171, the second spacer 172, the third spacer 173 and the color filter CF may include a photosensitive organic material.

According to another alternative exemplary embodiment, the third spacer 173 is disposed on test pad portions 511, 512, 513 and 514 and test line portions 521, 522, 523 and 524 such that a short circuit that may occur between the common electrode CE and respective ones of the test pad portions 511, 512, 513 and 514 and the test line portions 521, 522, 523 and 524 may be substantially prevented.

As set forth above, the display device according to one or more exemplary embodiments may provide the following effects.

A short circuit that may occur between the test pad and the common electrode may be substantially prevented by disposing a spacer between the test pad and the common electrode.

While the present inventive concept has been illustrated and described with reference to the exemplary embodiments thereof, it will be apparent to those of ordinary skill in the art that various changes in form and detail may be made thereto without departing from the spirit and scope of the present inventive concept.

What is claimed is:

1. A display device comprising:
   a first substrate and a second substrate, each comprising a display area and a non-display area;
   a thin film transistor disposed on the display area of the first substrate;
   a gate line and a data line connected to the thin film transistor;
   a test pad portion connected to the data line;
   a test line connecting the test pad portion and the data line; and
   a spacer disposed on the first substrate,
   wherein the spacer comprises:
      a first spacer disposed on the display area and supporting the first substrate and the second substrate;
      a second spacer disposed on the display area, the second spacer having a less height than a height of the first spacer; and
      a third spacer overlapping the test line and the test pad portion disposed on the non-display area, the third spacer not contacting the second substrate.

2. The display device as claimed in claim 1, wherein at least one of the test lines is disposed between the test pad portions.

3. The display device as claimed in claim 2, wherein the data line, the test line and the test pad portion are unitary.

4. The display device as claimed in claim 1, wherein the first spacer, the second spacer and the third spacer comprise a substantially same material.

5. The display device as claimed in claim 1, further comprising an insulating interlayer disposed on the first substrate.

6. The display device as claimed in claim 5, wherein the spacer comprises a substantially same material as a material comprised in the insulating interlayer.

7. The display device as claimed in claim 6, wherein the first spacer, the second spacer and the third spacer comprise an organic material.

8. The display device as claimed in claim 1, further comprising a black matrix disposed on the first substrate.

9. The display device as claimed in claim 8, wherein the spacer comprises a substantially same material as a material comprised in the black matrix.

10. The display device as claimed in claim 9, wherein the spacer comprises one of a metal, an opaque organic layer forming material and a photosensitive composition.

11. The display device as claimed in claim 1, further comprising a color filter at the display area of the first substrate.

12. The display device as claimed in claim 11, wherein the spacer comprises a substantially same material as a material comprised in the color filter.

13. The display device as claimed in claim 11, wherein the spacer comprises a photosensitive organic material.

14. The display device as claimed in claim 1, wherein the second spacer and the third spacer have a same height.

15. The display device as claimed in claim 14, wherein the spacer is disposed on a color filter on the first substrate.

16. The display device as claimed in claim 14, further comprising a color filter disposed on the first substrate and a black matrix disposed on the second substrate,
   wherein the spacer is formed of a same material as the color filter.

17. The display device as claimed in claim 14, wherein the spacer is disposed on a color filter on the first substrate.

18. The display device as claimed in claim 14, further comprising a color filter disposed on the first substrate and a black matrix disposed on the second substrate,
   wherein the spacer is formed of a same material as the color filter.

19. The display device as claimed in claim 1, wherein the second spacer has a height greater than that of the third spacer.

* * * * *